US012642125B2

(12) United States Patent \
Tsai et al.

(10) Patent No.: US 12,642,125 B2 \
(45) Date of Patent: May 26, 2026

(54) SEMICONDUCTOR PACKAGE STRUCTURE

(71) Applicant: MEDIATEK INC., Hsinchu City (TW)

(72) Inventors: Yi-Lin Tsai, Hsinchu City (TW); \
Nai-Wei Liu, Hsinchu City (TW); \
Wen-Sung Hsu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 344 days.

(21) Appl. No.: 18/342,149

(22) Filed: Jun. 27, 2023

(65) Prior Publication Data

US 2024/0038614 A1     Feb. 1, 2024

Related U.S. Application Data

(60) Provisional application No. 63/369,977, filed on Aug. 1, 2022.

(51) Int. Cl. \
*H01L 23/31* (2006.01) \
*H01L 23/00* (2006.01) \
(Continued)

(52) U.S. Cl. \
CPC ...... *H01L 23/3157* (2013.01); *H01L 23/3107* (2013.01); *H01L 23/49816* (2013.01); *H01L 23/49822* (2013.01); *H01L 23/49838* (2013.01); *H01L 24/16* (2013.01); *H01L 24/32* (2013.01); *H01L 24/73* (2013.01); *H01L 25/16* (2013.01); *H01L 2224/16227* (2013.01); *H01L 2224/16238* (2013.01); *H01L 2224/32225* (2013.01); \
(Continued)

(58) Field of Classification Search \
CPC ............. H01L 23/3157; H01L 23/3107; H01L 23/49816; H01L 23/49822; H01L 23/49838; H01L 24/16; H01L 24/32; H01L 24/73; H01L 25/16; H01L 2224/16227; H01L 2224/16238; H01L 2224/32225; H01L 2224/73204; H01L 2924/182 \
See application file for complete search history.

(56) References Cited

U.S. PATENT DOCUMENTS

2019/0198437 A1* 6/2019 Kim .................. H01L 23/49833 \
2021/0384143 A1  12/2021 Park \
(Continued)

FOREIGN PATENT DOCUMENTS

CN        114725032 A     7/2022

OTHER PUBLICATIONS

German language office action dated Dec. 1, 2025, issued in application No. DE 10 2023 118 502.0 (English language translation, pp. 1-7 of attachment).

*Primary Examiner* — Peniel M Gumedzoe \
(74) *Attorney, Agent, or Firm* — McClure, Qualey & Rodack, LLP

(57)                    ABSTRACT

A semiconductor package structure includes a substrate, a dummy conductive mesh structure, an interposer, an underfill material, and a semiconductor die. The substrate includes a wiring structure in dielectric layers. The dummy conductive mesh structure is embedded in the substrate and is spaced apart from the wiring structure by the dielectric layers. The interposer is disposed over the substrate. The underfill material extends between the substrate and the interposer and over the dummy conductive mesh structure. The semiconductor die is disposed over the interposer and is electrically coupled to the wiring structure through the interposer.

20 Claims, 5 Drawing Sheets

(51) Int. Cl.
    *H01L 23/498*        (2006.01)
    *H01L 25/16*         (2023.01)

(52) U.S. Cl.
    CPC .............. *H01L 2224/73204* (2013.01); *H01L 2924/182* (2013.01)

(56)               References Cited

U.S. PATENT DOCUMENTS

| | | | |
|---|---|---|---|
| 2022/0013497 A1* | 1/2022 | Choi ........................ | H01L 24/16 |
| 2022/0199593 A1* | 6/2022 | Yang ................... | H01L 25/0657 |
| 2023/0019311 A1* | 1/2023 | Kim .................. | H01L 23/49816 |

\* cited by examiner

SEMICONDUCTOR PACKAGE STRUCTURE

CROSS REFERENCE TO RELATED APPLICATIONS

This application claims the benefit of U.S. Provisional Application No. 63/369,977 filed on Aug. 1, 2022, the entirety of which is incorporated by reference herein.

BACKGROUND OF THE INVENTION

Field of the Invention

The present invention relates to semiconductor technology, and, in particular, to a semiconductor package structure that includes a protective structure.

Description of the Related Art

In addition to providing a semiconductor die with protection from environmental contaminants, a semiconductor package structure can also provide an electrical connection between the semiconductor die packaged inside it and a substrate such as a printed circuit board (PCB).

Although existing semiconductor package structures generally meet requirements, they have not been satisfactory in all respects. For example, stress may cause cracks in the semiconductor package structures when the semiconductor package structures are undergoing thermal treatment or reliability testing. Therefore, further improvements in semiconductor package structures are required.

BRIEF SUMMARY OF THE INVENTION

Semiconductor package structures are provided. An exemplary embodiment of a semiconductor package structure includes a substrate, a dummy conductive mesh structure, an interposer, an underfill material, and a semiconductor die. The substrate includes a wiring structure in dielectric layers. The dummy conductive mesh structure is embedded in the substrate and is spaced apart from the wiring structure by the dielectric layers. The interposer is disposed over the substrate. The underfill material extends between the substrate and the interposer and over the dummy conductive mesh structure. The semiconductor die is disposed over the interposer and is electrically coupled to the wiring structure through the interposer.

Another embodiment of a semiconductor package structure includes a substrate, a plurality of dummy conductive structures, an underfill material, an interposer, and a semiconductor die. The substrate includes a wiring structure in inter-metal dielectric layers. The plurality of dummy conductive structures extend below a top surface of the substrate and are spaced apart from the wiring structure by the inter-metal dielectric layers. The underfill material covers the plurality of dummy conductive structures. The interposer is disposed over the substrate and is electrically coupled to the wiring structure, wherein the interposer partially overlaps the plurality of dummy conductive structures in a top view. The semiconductor die is disposed over the interposer and is electrically coupled to the interposer.

Yet another embodiment of a semiconductor package structure includes a substrate, a dummy metal structure, an interposer, a plurality of bump structures, a semiconductor die, and an underfill material. The substrate includes a wiring structure in inter-metal dielectric layers. The dummy metal structure is disposed in the inter-metal dielectric layers, wherein a top surface of the dummy metal structure is not lower than a top surface of the wiring structure. The interposer is disposed over the dummy metal structure. The plurality of bump structures are adjacent to the dummy metal structure and electrically couple the interposer to the wiring structure. The semiconductor die is disposed over the interposer and electrically coupled to the interposer. The underfill material surrounds the plurality of bump structures and covers the dummy metal structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
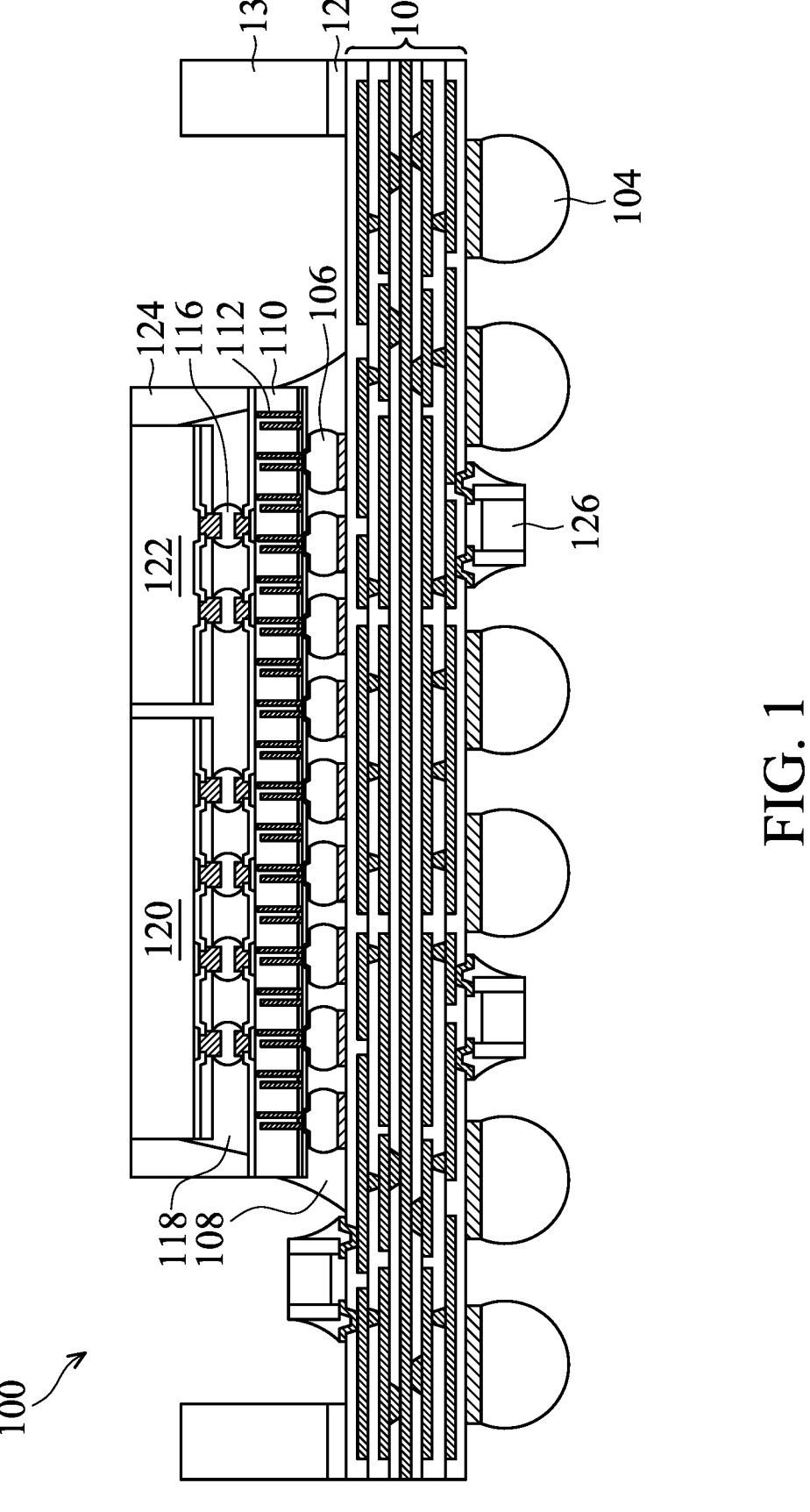
FIG. 1 is a cross-sectional view of an exemplary semiconductor package structure in accordance with some embodiments of the present disclosure.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description of "a first element over a second element" may include embodiments in which the first element is in direct contact with the second element, and may also include embodiments in which additional elements are disposed between the first element and the second element such that the first element and the second element are not in direct contact.

The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A semiconductor package structure including a dummy conductive structure is described in accordance with some embodiments of the present disclosure. The dummy conductive structure is embedded in a substrate to resist cracks propagating into the substrate, thereby avoiding electrical failure.

FIG. 1 is a cross-sectional view of a semiconductor package structure 100 in accordance with some embodiments of the present disclosure. Additional features can be added to the semiconductor package structure 100. Some of the features described below can be replaced or eliminated for different embodiments. To simplify the diagram, only a portion of the semiconductor package structure 100 is illustrated.

As illustrated in FIG. 1, the semiconductor package structure 100 includes a substrate 102, in accordance with some embodiments. The substrate 102 may be a coreless substrate or a cored substrate to prevent the substrate 102 from warpage. The substrate 102 may have a wiring structure therein. In some embodiments, the wiring structure includes conductive pads, conductive vias, conductive lines, conductive pillars, the like, or a combination thereof. The wiring structure may be formed of conductive material, including metal, such as copper, aluminum, tungsten, the like, an alloy thereof, or a combination thereof.

The wiring structure may be disposed in dielectric layers. The dielectric layers may also be referred to as inter-metal dielectric (IMD) layers. In some embodiments, the dielectric layers may be formed of organic materials, such as a polymer base material, non-organic materials, including silicon nitride, silicon oxide, silicon oxynitride, the like, or a combination thereof.

It should be noted that the configuration of the substrate 102 shown in the figures is exemplary only and is not intended to limit the present disclosure. Any desired semiconductor element may be formed in and on the substrate 102. However, in order to simplify the diagram, only the flat substrate 102 is illustrated.

The semiconductor package structure 100 includes a plurality of conductive terminals 104 disposed below the substrate 102 and electrically coupled to the wiring structure, in accordance with some embodiments. The conductive terminals 104 may include microbumps, controlled collapse chip connection (C4) bumps, solder balls, ball grid array (BGA) balls, the like, or a combination thereof. The conductive terminals 104 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

The semiconductor package structure 100 includes an interposer 110 disposed over the substrate 102, in accordance with some embodiments. The interposer 110 may include one or more through vias 112 therein. The through vias 112 may be formed of conductive materials, and the exemplary conductive materials are previously described. The through vias 112 may extend from a first surface of the interposer 110 to a second surface of the interposer 110 which is opposite to the first surface.

The through vias 112 may be electrically coupled to the wiring structure of the substrate 102 through a plurality of bump structures 106. The bump structures 106 may include microbumps, controlled collapse chip connection (C4) bumps, solder balls, ball grid array (BGA) balls, the like, or a combination thereof. The bump structures 106 may include the materials discussed above with respect to the conductive terminals 104, and will not be repeated.

The semiconductor package structure 100 includes an underfill material 108 extending between the interposer 110 and the substrate 102, in accordance with some embodiments. The underfill material 108 may surround the bump structures 106 and may fill in gaps between the bump structures 106 to provide structural support. In some embodiments, the underfill material 108 comprises polymer, such as epoxy. The underfill material 108 may be dispensed with capillary force, and then may be cured through any suitable curing process.

The semiconductor package structure 100 includes one or more semiconductor dies 120 and 122 disposed over the interposer 110, in accordance with some embodiments. In some embodiments, the semiconductor dies 120 and 122 each independently includes a system-on-chip (SoC) die, a logic device, a memory device, a radio frequency (RF) device, the like, or any combination thereof. For example, the semiconductor dies 120 and 122 may each include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (IO) die, a dynamic random access memory (DRAM) controller, a static random-access memory (SRAM), a high bandwidth memory (HBM), an application processor (AP) die, an application specific integrated circuit (ASIC) die, the like, or any combination thereof.

The semiconductor dies 120 and 122 may include the same or different devices. For example, the semiconductor die 120 may include an ASIC die, and the semiconductor die 122 may include an HBM. The semiconductor package structure 100 may include more than two semiconductor dies, and may also include one or more passive components disposed over the interposer 110, such as resistors, capacitors, or inductors.

The semiconductor dies 120 and 122 may be electrically coupled to the interposer 110 through a plurality of bump structures 116. The bump structures 116 may include microbumps, controlled collapse chip connection (C4) bumps, solder balls, ball grid array (BGA) balls, the like, or a combination thereof. The bump structures 116 may include the materials discussed above with respect to the bump structures 106 and will not be repeated.

The semiconductor package structure 100 includes an underfill material 118 extending between the interposer 110 and the semiconductor dies 120 and 122, in accordance with some embodiments. The underfill material 118 may surround the bump structures 116 and may fill in gaps between the bump structures 116 to provide structural support. The underfill material 118 may be similar to the underfill material 108, and will not be repeated.

The semiconductor package structure 100 includes a molding material 124 disposed over the interposer 110, in accordance with some embodiments. The molding material 124 may surround the semiconductor dies 120, 122, the bump structures 116, and the underfill material 118 to protect these components from the environment, thereby preventing them from damage due to stress, chemicals, and moisture. The molding material 124 may be formed of a nonconductive material, including moldable polymer, epoxy, resin, the like, or a combination thereof.

As shown in FIG. 1, a sidewall of the molding material 124 may be substantially coplanar with a sidewall of the interposer 110. In some embodiments, the top surfaces of the semiconductor dies 120, 122 are exposed by the molding material 124 as shown in FIG. 1.

The semiconductor package structure 100 includes a frame 130 attached to the substrate 102 through an adhesive layer 128, in accordance with some embodiments. The frame 130 may be disposed along the sidewalls of the substrate 102 to reduce warpage, prevent bending, and maintain planarity of the substrate 102. The frame 130 may surround the interposer 110 and the semiconductor dies 120, 122.

In some embodiments, the frame 130 and the adhesive layer 128 are separated from the underfill layer 128 by a gap. A portion of the top surface of the substrate 102 is thus exposed, and one or more passive components 126 may be disposed over the portion of the top surface of the substrate 102, such as resistors, capacitors, or inductors. The passive components 126 may also be disposed below the substrate 102 and between the conductive terminals 104.

According to some embodiments, cracks may form in the underfill material 108 when the semiconductor package structure 100 is under a thermal treatment or reliability test. The semiconductor package structure 100 includes one or more dummy conductive structures to resist the cracks propagating into the wiring structure of the substrate 102 and resulting in electrical failure. The semiconductor package structure 100 including the dummy conductive structures will be described with reference to FIG. 2.

Figure 2:
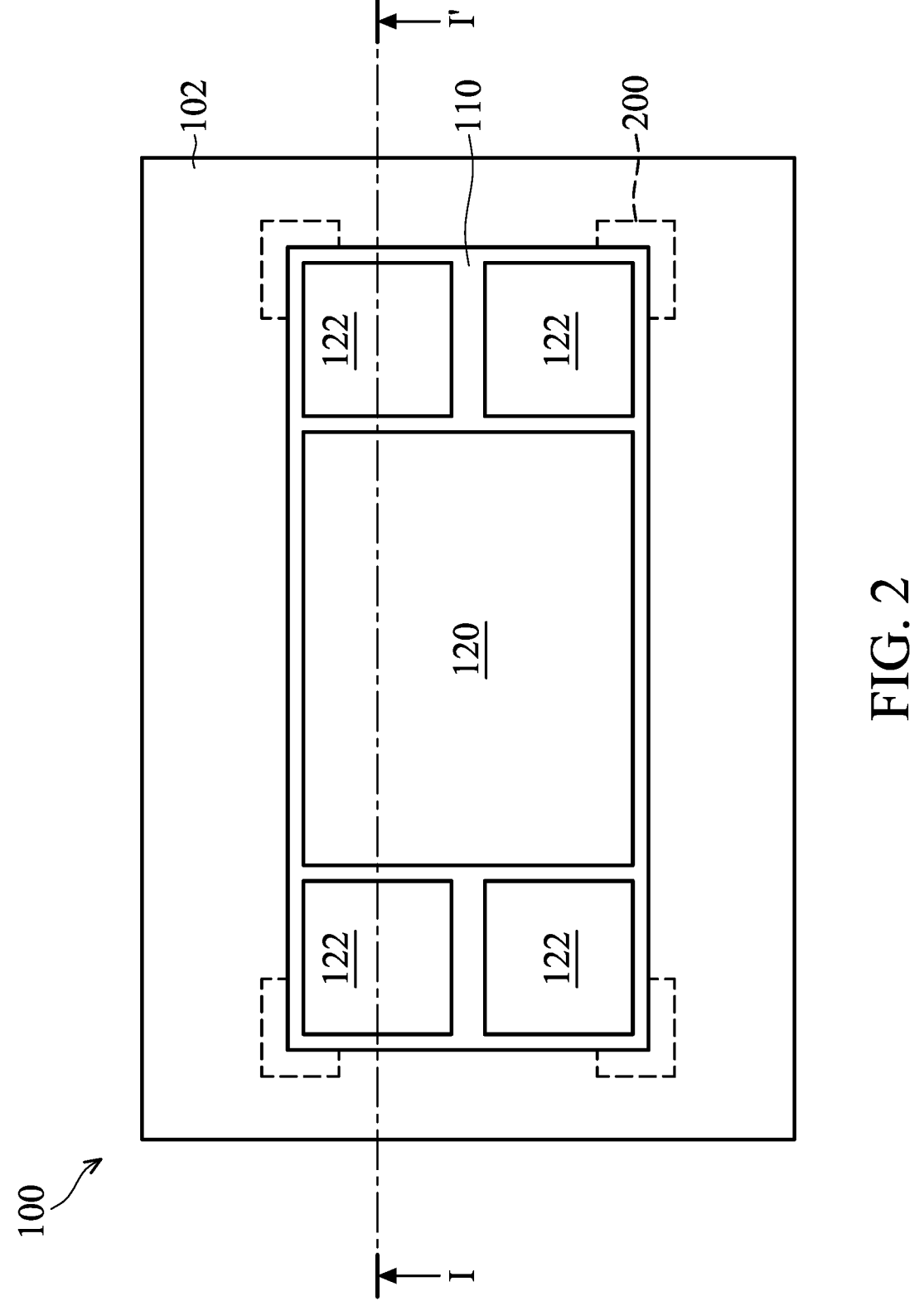
FIG. 2 is a top view of an exemplary semiconductor package structure in accordance with some embodiments of the present disclosure.

FIG. 2 is a top view of the semiconductor package structure 100 of FIG. 1, in accordance with some embodiments. FIG. 1 is a cross-sectional view of the semiconductor package structure 100 taken along line I-I' shown in FIG. 2.

As illustrated in FIG. 2, the semiconductor package structure 100 includes additional semiconductor dies 122 disposed over the interposer 110 and adjacent to the semiconductor die 120, in accordance with some embodiments. The semiconductor dies 120 and 122 may include the same or different devices, and the exemplary devices are previously described.

The semiconductor package structure 100 includes a plurality of dummy conductive structures 200 each partially overlapping corners of the interposer 110, in accordance with some embodiments. Since the corners may be prone to inducing stress, cracks may occur near the corners. Consequently, the dummy conductive structures 200 disposed directly below the corners of the interposer 110 can resist the cracks propagating into the wiring structure of the substrate 102, while taking up less space. A portion of the semiconductor package structure 100 which includes one of the dummy conductive structures 200 will be described with reference to FIG. 3.

Figure 3:
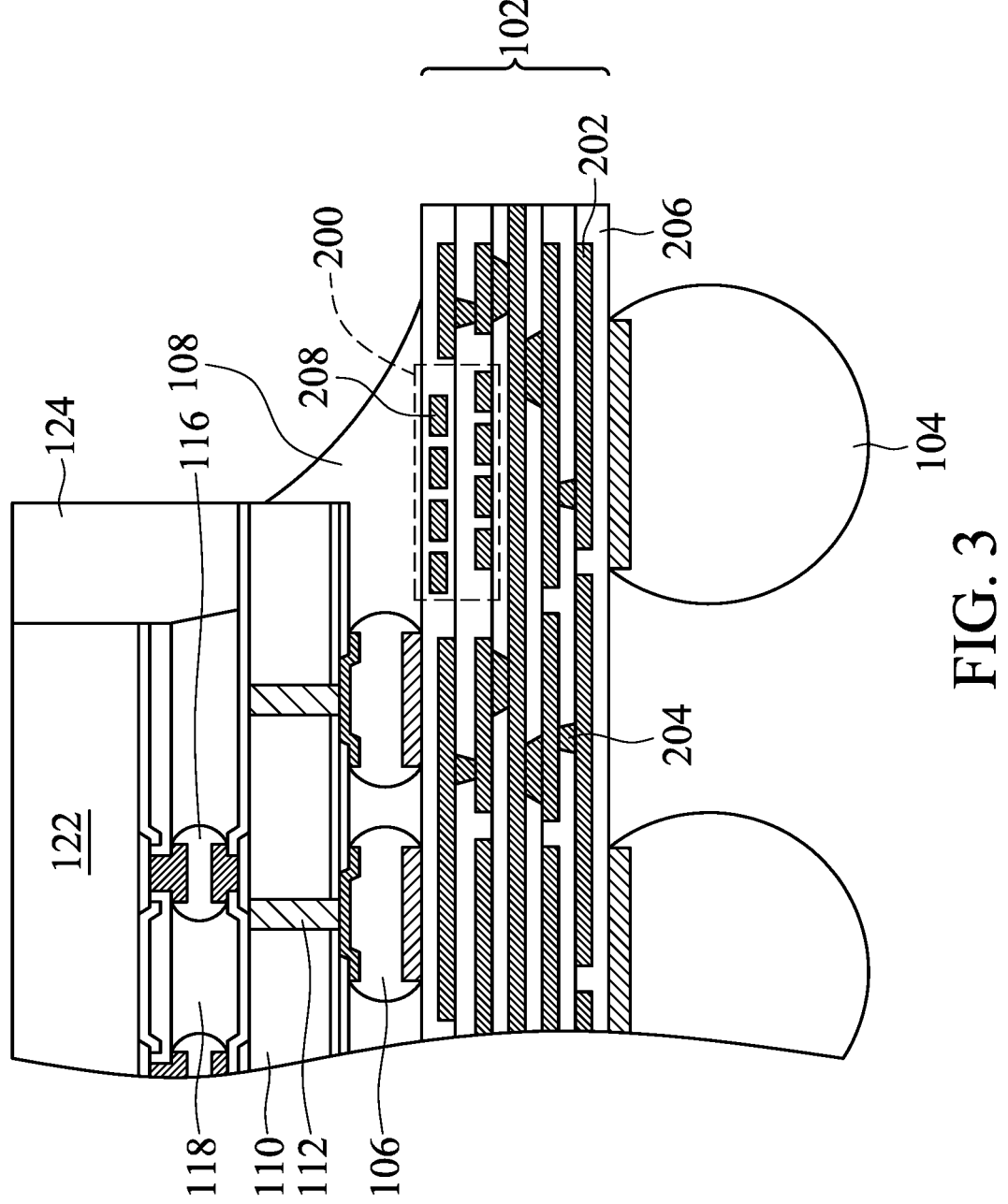
FIG. 3 is a cross-sectional view of a portion of an exemplary semiconductor package structure in accordance with some embodiments of the present disclosure.

FIG. 3 is a cross-sectional view of a portion of the semiconductor package structure 100, in accordance with some embodiments of the disclosure. The portion of the semiconductor package structure in FIG. 3 may include the same or similar components as that of the semiconductor package structure 100 in FIG. 1, and for the sake of simplicity, those components will not be discussed in detail again.

As illustrated in FIG. 3, the wiring structure of the substrate 102 includes horizontal interconnects, such as conductive layers 202, and vertical interconnects, such as conductive vias 204. The conductive vias 204 may electrically coupling different levels of the conductive layers 202. The conductive layers 202 and the conductive vias 204 may be disposed in dielectric layers (or inter-metal dielectric layers) 206.

The dummy conductive structure 200 may be formed of conductive material, including metal, such as copper, aluminum, tungsten, the like, an alloy thereof, or a combination thereof. The dummy conductive structure 200 may also be referred to as dummy metal structure. In some embodiments, the dummy conductive structure 200 and the conductive layers 202 are made of the same material and are formed in the same process to reduce costs and simplify the processing. The dummy conductive structure 200 may be surrounded by the dielectric layers 206 and not be electrically coupled to the wiring structure.

The dummy conductive structure 200 may be disposed adjacent to the bump structures 106. The underfill material 108 may cover the top surface of the dummy conductive structure 200. In particular, the underfill material 108 may extend from an edge of the dummy conductive structure 200 to another edge of the dummy conductive structure 200.

The dummy conductive structure 200 may be disposed at the topmost level to resist the crack propagation. In particular, the top surface of the dummy conductive structure 200 may be substantially leveled to or higher than the top surface of the wiring structure (such as the topmost layer of the conductive layers 202).

In some embodiments, the dummy conductive structure 200 has one or more dummy conductive layers 208. The dummy conductive structure 200 may include two dummy conductive layers 208 as shown in FIG. 3, but is not limited thereto. For example, the dummy conductive structure 200 may include one dummy conductive layer 208 or more than two dummy conductive layers 208. In some embodiments, adjacent dummy conductive layers 208 are staggered, as shown in FIG. 3. In some other embodiments, adjacent dummy conductive layers 208 are aligned with each other.

As shown in FIG. 3, adjacent dummy conductive layers 208 may be separated by the dielectric layers 206, but is not limited thereto. For example, the dummy conductive structure 200 may include one or more conductive vias (not illustrated) connecting the adjacent dummy conductive layers 208. The dielectric layers 206 may cover the top surface of the dummy conductive structure 200.

The dummy conductive structure 200 may be surrounded by the wiring structure. In particular, some of the conductive layers 202 and the conductive vias 204 may be disposed on opposite sides of the dummy conductive structure 200, and some of the conductive layers 202 may extend below the bottom surface of the dummy conductive structure 200.

As previously mentioned, in some embodiments, the substrate 102 may be a cored substrate. In these embodiments, the substrate 102 includes a package core (not illustrated) disposed below the dummy conductive structure 200. Depending on design, a portion of the wiring structure may be disposed between the dummy conductive structure 200 and the package core.

Figure 4A:
FIGS. 4A and 4B are top views of a portion of an exemplary semiconductor package structure in accordance with some embodiments of the present disclosure.
Figure 4B:
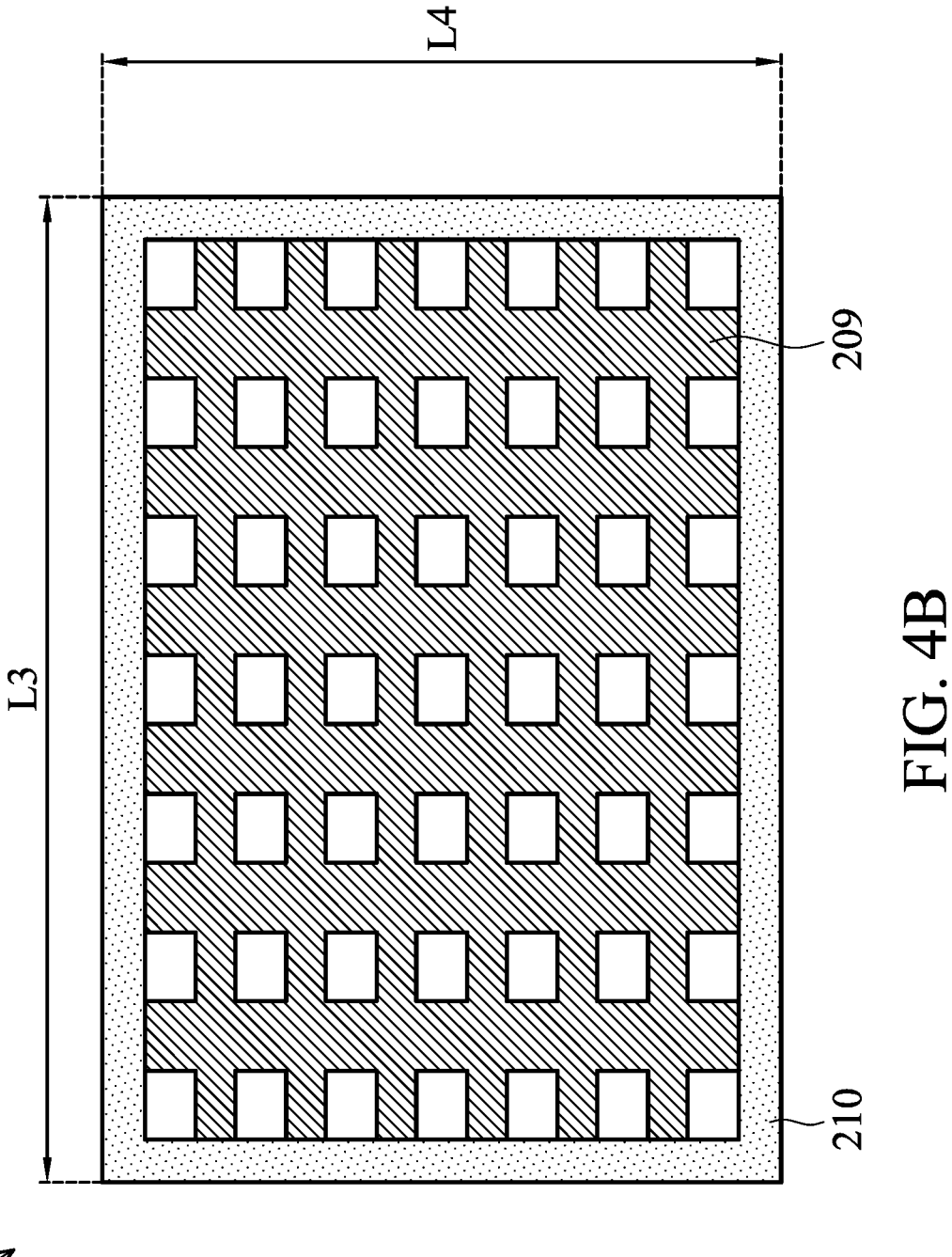

The configuration of the dummy conductive layer 208 will be described with reference to FIGS. 4A and 4B. FIGS. 4A and 4B are top views of the dummy conductive layer 208 of FIG. 3, in accordance with some embodiments.

FIG. 4A is a top view of a dummy conductive layer 208*a*, in accordance with some embodiments. To simplify the diagram, only a portion of the dummy conductive layer 208*a* is illustrated. As shown in FIG. 4A, the dummy conductive layer 208*a* include a mesh structure 209, in accordance with some embodiments. The dummy conductive structure may also be referred to as a dummy conductive mesh structure.

In some embodiments, the mesh structure 209 is continuous as shown in FIG. 4A. In some other embodiments, the mesh structure 209 is discontinuous, such as including a plurality of dashed conductive lines. In some embodiments, the space in the mesh structure 209 is filled with dielectric materials, such as the dielectric layer 206 as shown in FIG. 3.

The dummy conductive layer 208*a* may have a quadrilateral shape, an elliptical shape, or any suitable shapes in the top view. For example, the dummy conductive layer 208a may have a rectangle shape as shown in FIG. 4A. For another example, the dummy conductive layer 208a may be round.

The dummy conductive layer 208a may have a dimension in a range of about 50 μm to about 300 μm, such as 200 μm. For example, in the embodiments where the dummy conductive layer 208a has a quadrilateral shape, a length L1 or L2 of the dummy conductive layer 208a may be in a range of about 50 μm to about 300 μm, such as 200 μm. For another example, in the embodiments where the dummy conductive layer 208a has an elliptical shape, the length of the major axis or the minor axis of the dummy conductive layer 208 may be in a range of about 50 μm to about 300 μm, such as 200 μm.

Different levels of the dummy conductive structure may have the same or different dimensions. For example, the upper layer of the dummy conductive structure may have a greater dimension than that of the lower layer of the dummy conductive structure. Different levels of the dummy conductive structure may have the same or different densities of the mesh structure 209 (i.e., the distances between the lines). For example, the upper layer of the dummy conductive structure may have a greater density of the mesh structure 209 than that of the lower layer of the dummy conductive structure.

FIG. 4B is a top view of a dummy conductive layer 208b, in accordance with some embodiments. To simplify the diagram, only a portion of the dummy conductive layer 208b is illustrated. The dummy conductive layer 208b in FIG. 4B may include the same or similar components as that of the dummy conductive layer 208a in FIG. 4A, and for the sake of simplicity, those components will not be discussed in detail again.

As shown in FIG. 4B, the dummy conductive layer 208b include a mesh structure 209 and a conductive ring 210, in accordance with some embodiments. The conductive ring 210 may be formed of conductive material, including metal, such as copper, aluminum, tungsten, the like, an alloy thereof, or a combination thereof. The conductive ring 210 may also be referred to as a metal ring. The mesh structure 209 and the conductive ring 210 may be formed of the same or different materials.

The mesh structure 209 may be in contact with the conductive ring 210 as shown in FIG. 4B. Alternatively, the mesh structure 209 and the conductive ring 210 may be spaced apart by the dielectric layer 206 as shown in FIG. 3. The mesh structure 209 and the conductive ring 210 may have the same or different thicknesses in the direction vertical to the top surface of the dummy conductive layer 208b.

In some embodiments, the mesh structure 209 is continuous as shown in FIG. 4B. In some other embodiments, the mesh structure 209 is discontinuous, such as including a plurality of dashed conductive lines. In some embodiments, the space in the mesh structure 209 is filled with dielectric materials, such as the dielectric layer 206 as shown in FIG. 3. Similarly, the conductive ring 210 may be continuous or discontinuous.

The dummy conductive layer 208b may have a quadrilateral shape, an elliptical shape, or any suitable shapes in the top view. For example, the dummy conductive layer 208b may have a rectangle shape as shown in FIG. 4B. For another example, the dummy conductive layer 208b may be round. The mesh structure 209 and the conductive ring 210 may have corresponding shape.

The dummy conductive layer 208b may have a dimension in a range of about 50 μm to about 300 μm, such as 200 μm.

For example, in the embodiments where the dummy conductive layer 208b has a quadrilateral shape, a length L3 or L4 of an edge of the conductive ring 210 may be in a range of about 50 μm to about 300 μm, such as 200 μm. For another example, in the embodiments where the dummy conductive layer 208b has an elliptical shape, the length of the major axis or the minor axis of the conductive ring 210 may be in a range of about 50 μm to about 300 μm, such as 200 μm.

Different levels of the dummy conductive structure may have the same or different configurations. For example, the top dummy conductive layer may include the conductive ring 210, such as shown in FIG. 4B, and the bottom dummy conductive layer may not include the conductive ring 210, such as shown in FIG. 4A.

In summary, the semiconductor package structure according to the present disclosure includes one or more dummy conductive structures embedded in a substrate, so that crack propagation can be blocked. As a result, the failure rate during system assembly can be reduced. In addition, the dummy conductive structures partially overlapping corners of an interposer can reduce the occupied space. Furthermore, the dummy conductive structures may be formed during the formation of a wiring structure in the substrate to avoid incurring additional costs and complicating the processing.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a substrate comprising a wiring structure in dielectric layers;
   a dummy conductive mesh structure embedded in the substrate and spaced apart from the wiring structure by the dielectric layers, wherein a top surface of the dummy conductive mesh structure is above a topmost surface of the wiring structure;
   an interposer disposed over the substrate;
   an underfill material extending between the substrate and the interposer and over the dummy conductive mesh structure; and
   a semiconductor die disposed over the interposer and electrically coupled to the wiring structure through the interposer.

2. The semiconductor package structure as claimed in claim 1, wherein the dummy conductive mesh structure partially overlaps a corner of the interposer when viewed in a direction that is substantially perpendicular to a top surface of the substrate.

3. The semiconductor package structure as claimed in claim 1, further comprising a plurality of dummy conductive mesh structures embedded in the substrate and partially overlapping each corner of the interposer when viewed in a direction that is substantially perpendicular to a top surface of the substrate.

4. The semiconductor package structure as claimed in claim 1, wherein the dummy conductive mesh structure comprises metal.

5. The semiconductor package structure as claimed in claim 1, further comprising a conductive ring surrounding the dummy conductive mesh structure and spaced apart from the wiring structure by the dielectric layers.

6. The semiconductor package structure as claimed in claim 1, wherein the substrate comprises a package core disposed below the dummy conductive mesh structure.

7. The semiconductor package structure as claimed in claim 1, further comprising a plurality of bump structures electrically coupling the interposer to the wiring structure, wherein the underfill material extends between the dummy conductive mesh structure and the plurality of bump structures.

8. The semiconductor package structure as claimed in claim 1, further comprising a frame attached to the substrate through an adhesive layer.

9. A semiconductor package structure, comprising:
   a substrate comprising a wiring structure in inter-metal dielectric layers;
   a plurality of dummy conductive structures extending below a top surface of the substrate and spaced apart from the wiring structure by the inter-metal dielectric layers, wherein a top surface of the plurality of dummy conductive structures is above a topmost surface of the wiring structure;
   an underfill material covering the plurality of dummy conductive structures;
   an interposer disposed over the substrate and electrically coupled to the wiring structure, wherein the interposer partially overlaps the plurality of dummy conductive structures in a top view; and
   a semiconductor die disposed over the interposer and electrically coupled to the interposer.

10. The semiconductor package structure as claimed in claim 9, further comprising a molding material disposed over the interposer and surrounding the semiconductor die.

11. The semiconductor package structure as claimed in claim 10, wherein a sidewall of the molding material is substantially coplanar with a sidewall of the interposer.

12. The semiconductor package structure as claimed in claim 10, further comprising a plurality of bump structures surrounded by the molding material and electrically coupling the semiconductor die to the interposer.

13. The semiconductor package structure as claimed in claim 9, wherein each of the plurality of dummy conductive structures partially overlaps a corner of the interposer in the top view.

14. The semiconductor package structure as claimed in claim 9, wherein the plurality of dummy conductive structures and the wiring structure are formed of a same material.

15. The semiconductor package structure as claimed in claim 9, wherein the plurality of dummy conductive structures have a quadrilateral shape in the top view and have a dimension in a range of about 50 μm to about 300 μm.

16. The semiconductor package structure as claimed in claim 9, wherein the plurality of dummy conductive structures have an elliptical shape in the top view and have a dimension in a range of about 50 μm to about 300 μm.

17. A semiconductor package structure, comprising:
   a substrate comprising a wiring structure in inter-metal dielectric layers;
   a dummy metal structure disposed in the inter-metal dielectric layers, wherein a top surface of the dummy metal structure is above a topmost surface of the wiring structure;
   an interposer disposed over the dummy metal structure;
   a plurality of bump structures adjacent to the dummy metal structure and electrically coupling the interposer to the wiring structure;
   a semiconductor die disposed over the interposer and electrically coupled to the interposer; and
   an underfill material surrounding the plurality of bump structures and covering the dummy metal structure.

18. The semiconductor package structure as claimed in claim 17, wherein a portion of the wiring structure extends below a bottom surface of the dummy metal structure.

19. The semiconductor package structure as claimed in claim 17, wherein in a top view, a first edge of the dummy metal structure is covered by the interposer, and a second edge of the dummy metal structure is outside of the interposer.

20. The semiconductor package structure as claimed in claim 19, wherein the underfill material covers the first edge and the second edge of the dummy metal structure in the top view.

* * * * *